United States Patent
Imakiire et al.

(10) Patent No.: US 10,156,482 B2
(45) Date of Patent: Dec. 18, 2018

(54) SEMICONDUCTOR CHIP TEMPERATURE ESTIMATION DEVICE AND OVERHEAT PROTECTION DEVICE

(71) Applicant: FUJI ELECTRIC CO., LTD., Kawasaki-shi (JP)

(72) Inventors: Akihiro Imakiire, Hino (JP); Akihiro Odaka, Hino (JP); Shinichiro Adachi, Matsumoto (JP)

(73) Assignee: FUJI ELECTRIC CO., LTD., Kawasaki-Shi (JP)

( * ) Notice: Subject to any disclaimer, the term of this patent is extended or adjusted under 35 U.S.C. 154(b) by 625 days.

(21) Appl. No.: 14/680,056

(22) Filed: Apr. 6, 2015

(65) Prior Publication Data
US 2015/0211938 A1 Jul. 30, 2015

Related U.S. Application Data

(63) Continuation of application No. PCT/JP2013/080409, filed on Nov. 11, 2013.

(30) Foreign Application Priority Data

Dec. 12, 2012 (JP) .................. 2012-270863

(51) Int. Cl.
*G01K 1/12* (2006.01)
*H02M 1/32* (2007.01)
(Continued)

(52) U.S. Cl.
CPC ................. *G01K 1/12* (2013.01); *G01K 7/16* (2013.01); *G01K 7/22* (2013.01); *G01K 7/42* (2013.01);
(Continued)

(58) Field of Classification Search
CPC .. G01K 1/12; G01K 7/16; G01K 7/22; G01K 7/42; H02P 29/68; H02M 1/32;
(Continued)

(56) References Cited

U.S. PATENT DOCUMENTS 6,400,045 B1 * 6/2002 Hosokawa ................ G06F 1/20
307/117
8,582,335 B2 11/2013 Hasegawa et al.
(Continued)

FOREIGN PATENT DOCUMENTS

CN 102474198 A 5/2012
DE 102011007491 A1 10/2012
(Continued)

OTHER PUBLICATIONS

Fuji Electric, Co., Ltd. "Chapter 6: Cooling Design" (p. 6-1 to 6-15) May 2011; Fuji IGBT Modules Application Manual.
(Continued)

*Primary Examiner* — Sung Cho
(74) *Attorney, Agent, or Firm* — Rabin & Berdo, P.C.

(57) ABSTRACT

A semiconductor chip temperature estimation device that estimates the temperature of a semiconductor chip incorporated together with a thermistor in a semiconductor module includes a first estimation unit which calculates a first estimation value of a chip loss of the chip, a memory which stores in advance a correlation between a temperature rise of the temperature sensor and the chip loss of the chip, a second estimation unit which calculates a second estimation value of the temperature rise of the temperature sensor, and a third estimation unit which calculates a third estimation value of the temperature of the cooling element. The temperature of the semiconductor chip is estimated by using the third estimation value as a base temperature.

17 Claims, 8 Drawing Sheets

(51) Int. Cl.
*G01K 7/16* (2006.01)
*G01K 7/42* (2006.01)
*G01K 7/22* (2006.01)
*H02P 29/68* (2016.01)
*H02H 7/12* (2006.01)
*H02M 7/5387* (2007.01)
*H01L 27/02* (2006.01)

(52) U.S. Cl.
CPC .............. *H02M 1/32* (2013.01); *H02P 29/68* (2016.02); *H01L 27/0248* (2013.01); *H02H 7/12* (2013.01); *H02M 7/5387* (2013.01); *H02M 2001/327* (2013.01)

(58) Field of Classification Search
CPC .......... H02M 7/5387; H02M 2001/327; H01L 27/0248; H02H 7/12
See application file for complete search history.

(56) References Cited

U.S. PATENT DOCUMENTS

| | | | | |
|---|---|---|---|---|
| 9,236,826 | B2* | 1/2016 | Djonga | H02H 6/00 |
| 2002/0006154 | A1 | 1/2002 | Nada | |
| 2003/0016498 | A1* | 1/2003 | Kurokawa | H05K 7/20254 |
| | | | | 361/699 |
| 2005/0204761 | A1* | 9/2005 | Karikomi | G01K 7/425 |
| | | | | 62/228.1 |
| 2007/0049133 | A1* | 3/2007 | Conroy | G06F 1/26 |
| | | | | 439/894 |
| 2007/0161878 | A1* | 7/2007 | Lilie | G01W 1/02 |
| | | | | 600/345 |
| 2007/0200004 | A1* | 8/2007 | Kasper | F24F 11/30 |
| | | | | 236/44 C |
| 2008/0041076 | A1* | 2/2008 | Tutunoglu | F25B 49/005 |
| | | | | 62/181 |
| 2008/0262750 | A1* | 10/2008 | Ibori | H02M 5/451 |
| | | | | 702/34 |
| 2012/0217795 | A1* | 8/2012 | Hasegawa | B60L 3/003 |
| | | | | 307/9.1 |
| 2012/0255318 | A1* | 10/2012 | Kido | F25B 31/006 |
| | | | | 62/126 |
| 2012/0281433 | A1* | 11/2012 | Yamanaka | H02M 7/003 |
| | | | | 363/13 |
| 2013/0147407 | A1 | 6/2013 | Kawamura | |
| 2014/0084830 | A1* | 3/2014 | Djonga | H02H 6/00 |
| | | | | 318/400.42 |
| 2015/0211938 | A1* | 7/2015 | Imakiire | H02M 1/32 |
| | | | | 702/133 |

FOREIGN PATENT DOCUMENTS

| | | |
|---|---|---|
| JP | 05-068331 A | 3/1993 |
| JP | 3075303 B | 8/2000 |
| JP | 2001-318008 | 11/2001 |
| JP | 2005-124387 | 5/2005 |
| JP | 2008-151739 | 7/2008 |
| JP | 2011-135713 | 7/2011 |
| JP | 2012-075234 | 4/2012 |

OTHER PUBLICATIONS

Fuji Electric, Co., Ltd. "Chapter 3: Heat Dissipation Design" (p. 3-1 to 3-14), Jun. 30, 2014; Automotive IGBT Module Application Note.

* cited by examiner

SEMICONDUCTOR CHIP TEMPERATURE ESTIMATION DEVICE AND OVERHEAT PROTECTION DEVICE

This application is a continuation under 35 U.S.C. 120 of International Application PCT/JP2013/080409 having the International Filing Date of Nov. 11, 2013. The identified application is fully incorporated herein by reference.

BACKGROUND OF THE INVENTION

Field of the Invention

The present invention relates to a semiconductor chip temperature estimation device included in, for example, a semiconductor module, and to an overheat protection device for protecting a power converter from an overheat accident using the temperature estimation device.

Description of Related Art

For a power converter in which a semiconductor module is mounted, there is a method whereby the temperature of a semiconductor chip included in the semiconductor module is estimated, and the current flowing through the semiconductor chip is limited before the estimated temperature exceeds an allowable temperature and causes destruction, thereby realizing overheat protection of the semiconductor chip and power converter. Such related art that estimates semiconductor chip temperature is disclosed in a paragraph [0006] FIG. 1, and the like of Japanese Patent No. 3,075,303 (Patent Document 1) and paragraphs [0021] to [0030], FIG. 1, and the like of Japanese Patent Application Laid-Open Publication No. 2005-124387 (Patent Document 2).

FIG. 7 is a block diagram showing the related art described in Patent Document 1. In FIG. 7, 101 is a rectifier circuit connected to a 3-phase alternating current power supply (not shown), 102 is a smoothing capacitor, 103 is a heat sink in which are installed an inverter 104 and thermistor 105, and 106 is a motor driven by the inverter 104. Also, 200 is a control device that controls a semiconductor switching element of the inverter 104, 201 and 202 are first and second set temperatures, 203 is a current detector, 204 and 205 are comparators, 206 is a current interrupting function, 207 is a current limiting function, 208 is a PWM control unit, 209 is a temperature detection unit, and 210 is a Tj (junction temperature) estimation unit.

In such related art, a temperature detection value of the heat sink 103 obtained by the thermistor 105 and temperature detection unit 209, a value of the current of the motor 106 detected by the current detector 203, and a drive signal (carrier frequency) from the PWM control unit 208 are input into the Tj estimation unit 210. Temperature rise in accordance with "chip loss" (power loss) of a semiconductor chip including conduction loss and switching loss is calculated based on the current detection value and drive signal in the Tj estimation unit 210, and the temperature rise is added to the temperature detection value of the heat sink 103, thereby estimating the junction temperature (semiconductor chip temperature) of the semiconductor switching element. Further, when the estimated semiconductor chip temperature exceeds the first set temperature 201, the current of the inverter 104 is limited by the current limiting function 207, while when the semiconductor chip temperature exceeds the second set temperature 202, which is higher than the first set temperature 201, the current of the inverter 104 is interrupted by the current interrupting function 206, thereby realizing overheat protection.

A power converter control device that, when a synchronous motor takes on a stalled state, limits the output current of the inverter so that the semiconductor chip temperature estimation value does not exceed an allowed value is disclosed in Patent Document 2.

In the related art described in Patent Documents 1 and 2, a detected temperature value detected by a temperature sensor such as a thermistor is taken to be temperature of a cooling body or cooling medium for cooling a semiconductor chip, and the temperature of the semiconductor chip is estimated by adding a temperature rise caused by semiconductor chip loss and the detected temperature value detected by the temperature sensor. For example, FIG. 8 is a schematic view showing a semiconductor chip temperature estimation function in the Tj estimation unit 210 of FIG. 7, wherein 210a is temperature rise estimation means, 210b is adder and subtractor means, 210c is a semiconductor chip loss calculation unit, and 210d is a semiconductor chip temperature rise calculation unit. As shown in the drawing, a value that is the estimated value of the temperature rise caused by semiconductor chip loss and a value of temperature detected by the thermistor 105 added together is output as a semiconductor chip temperature estimation value in the Tj estimation unit 210.

SUMMARY OF THE INVENTION

As previously described, in Patent Documents 1 and 2, detecting a cooling body temperature or cooling medium temperature as a reference temperature for estimating the semiconductor chip temperature is a precondition. Therefore, it is necessary to install a temperature sensor such as a thermistor in the cooling body. Thus, there is a problem in that the number of parts increases because of the temperature sensor, leading to an increase in cost and an increase in size of the power converter.

In response to the heretofore described problem, there is a method whereby, by a thermistor being incorporated in a semiconductor module formed of a plurality of semiconductor chips, the temperature of a cooling body or the like is estimated by the thermistor incorporated in the semiconductor module, without installing a separate thermistor in the cooling body or the like. However, according to this method, it may happen that it is not possible for the thermistor to accurately estimate the temperature of the cooling body or the like due to the effect of heat generated by a semiconductor chip in the vicinity of the thermistor.

Further, there is a method whereby the temperature of the semiconductor chip is estimated by a thermistor incorporated in a semiconductor module, and overheat protection carried out. However, there is a problem in that overheat protection cannot be effectively carried out because this method is such that in a state wherein a semiconductor chip in a position far from the thermistor generates heat while a semiconductor chip in the vicinity of the thermistor barely generates any heat, the thermistor is barely affected by the heat generated by the semiconductor chip in the distant position.

Therefore, the problem to be resolved by the invention is to provide a semiconductor chip temperature estimation device which is capable of accurately estimating the temperature of a cooling body or cooling medium (hereafter, these will also be referred to collectively as the "cooling element"). The temperature of the cooling element forms a base temperature for estimating the semiconductor chip temperature even when a semiconductor chip in the vicinity of a temperature sensor such as a thermistor generates heat. Therefore, by accurately estimating the temperature of the cooling element, it is not necessary for the semiconductor module to install a temperature sensor for detecting the temperature of the cooling element, thereby achieving a reduction in cost and a reduction in size of the power converter. Also, another problem to be resolved by the invention is to provide an overheat protection device that protects the semiconductor chip and power converter from an overheat accident by limiting a value of current flowing through the semiconductor chip based on a semiconductor chip temperature estimation value.

Additional or separate features and advantages of the invention will be set forth in the descriptions that follow and in part will be apparent from the description, or may be learned by practice of the invention. The objectives and other advantages of the invention will be realized and attained by the structure particularly pointed out in the written description and claims thereof as well as the appended drawings.

To achieve these and other advantages and in accordance with the purpose of the present invention, as embodied and broadly described, in one aspect, a semiconductor chip temperature estimation device according to the invention which estimates temperature of a semiconductor chip incorporated together with a temperature sensor such as a thermistor in a semiconductor module.

The semiconductor chip temperature estimation device includes a first estimation unit which calculates chip loss of the semiconductor chip as a first estimation value using a value of current flowing through the chip and the value of a switching frequency used by a semiconductor switching element included in the chip, a memory which stores in advance a correlation between a temperature rise of the temperature sensor and the chip loss of the semiconductor chip, the temperature rise being a difference between a detected temperature value detected by the temperature sensor and temperature of a cooling element, the cooling element cooling the semiconductor module, a second estimation unit which calculates the temperature rise of the temperature sensor as a second estimation value by using the first estimation value semiconductor chip loss and the correlation stored in the memory, and a third estimation unit which calculates the temperature of the cooling element as a third estimation value by subtracting the second estimation value from the detected temperature value. The temperature of the semiconductor chip is estimated by using the third estimation value as a base temperature.

The semiconductor chip temperature estimation device according to the above aspect of the invention, the correlation may be such that a relationship between the temperature rise of the temperature sensor and the chip loss of the semiconductor chip is approximated by a first-order lag element.

The semiconductor chip temperature estimation device according to the above aspect of the invention, the semiconductor module may include a plurality of semiconductor chips, and a total temperature rise of the temperature sensor is calculated using respective individual temperature rises of the plurality of semiconductor chips, the first estimation unit calculates respective individual chip losses of the plurality of semiconductor chips as an individual first estimation value, respectively, the memory stores in advance a plurality of individual correlations of respective individual temperature rises of the temperature sensor caused by the respective individual chip losses, the second estimation unit calculates each of the individual temperature rises of the temperature sensor as individual second estimation values using each of the respective individual first estimation values and each of the respective individual correlations stored in the memory, respectively, and the third estimation unit calculates an estimation value by subtracting a total value of each of the individual second estimation values from the detected temperature value, as the third estimation value.

The semiconductor chip temperature estimation device according to the above aspect of the invention, the correlation may be such that a relationship between the temperature rise of the temperature sensor and the chip loss of the chip is approximated by a sum of a plurality of first-order lag elements.

The semiconductor chip temperature estimation device according to the above aspect of the invention, may further include a fourth estimation unit which calculates a temperature rise of the chip as a fourth estimation value, the temperature rise of the chip being a difference of temperatures between the semiconductor chip and the cooling element, wherein the temperature of the semiconductor chip may be estimated by adding the third estimation value and the fourth estimation value.

The semiconductor chip temperature estimation device according to the above aspect of the invention, the fourth estimation unit may include a fifth estimation unit which calculates a fifth estimation value of a chip loss of the semiconductor chip by using a value of current flowing through the semiconductor chip and a value of a switching frequency used by the semiconductor switching element included in the semiconductor chip, and a sixth estimation unit which calculates the fourth estimation value of the temperature rise of the chip by using the fifth estimation value.

The semiconductor chip temperature estimation device according to the above aspect of the invention, the cooling element in the semiconductor chip temperature estimation device may be a cooling medium which cools the semiconductor module.

The semiconductor chip temperature estimation device according to the above aspect of the invention, may further include a chip temperature estimation unit which calculate an estimation value of the temperature of the semiconductor chip. The chip temperature estimation unit may calculate the estimation value of the temperature of the semiconductor chip by adding the third estimation value of the temperature of the cooling element and the fourth estimation value of the temperature rise of the chip.

In one aspect, an overheat protection device according to the invention includes a semiconductor chip temperature estimation device incorporated together with a temperature sensor in a semiconductor module, and a control unit which limits current flowing through a semiconductor chip when the temperature of the semiconductor chip estimated by the estimation device, The semiconductor chip temperature estimation device includes a first estimation unit which calculates chip loss of the semiconductor chip as a first estimation value, a memory which stores in advance a correlation between a temperature rise of the temperature sensor and the chip loss, the temperature rise of the temperature sensor being a difference between a detected temperature value detected by the temperature sensor and temperature of a cooling element, the cooling element cooling the semiconductor module, a second estimation unit which calculates the temperature rise of the temperature sensor as a second estimation value by using the first estimation value and the correlation stored in the memory, and a third estimation unit which calculates the temperature of the cooling element as a third estimation value by subtracting the second estimation value from the detected temperature value. The temperature of the semiconductor chip is estimated by using the third estimation value as a base temperature.

According to the invention, it is possible, without installing a separate temperature sensor such as a thermistor in a cooling element such as a cooling medium or cooling body, to estimate the cooling element temperature. Because of this, it is possible to reduce the number of parts, thus achieving a reduction in size and a reduction in cost of the power converter.

Also, even when the temperature sensor is affected by heat generated by a semiconductor chip in the vicinity, it is possible to estimate the cooling element temperature with high accuracy by subtracting temperature rise based on a predetermined correlation from the value of the temperature detected by the temperature sensor.

The invention is such that, as the cooling element temperature estimation value is highly reliable, as heretofore described, a semiconductor chip temperature estimation value with the cooling element temperature estimation value as abase temperature is also highly reliable, and it is thus possible to carry out overheat protection of the semiconductor chip and power converter safely and reliably.

DETAILED DESCRIPTION OF THE PREFERRED EMBODIMENT

Hereafter, based on the drawings, a description will be given of an embodiment of the invention.

Figure 1:
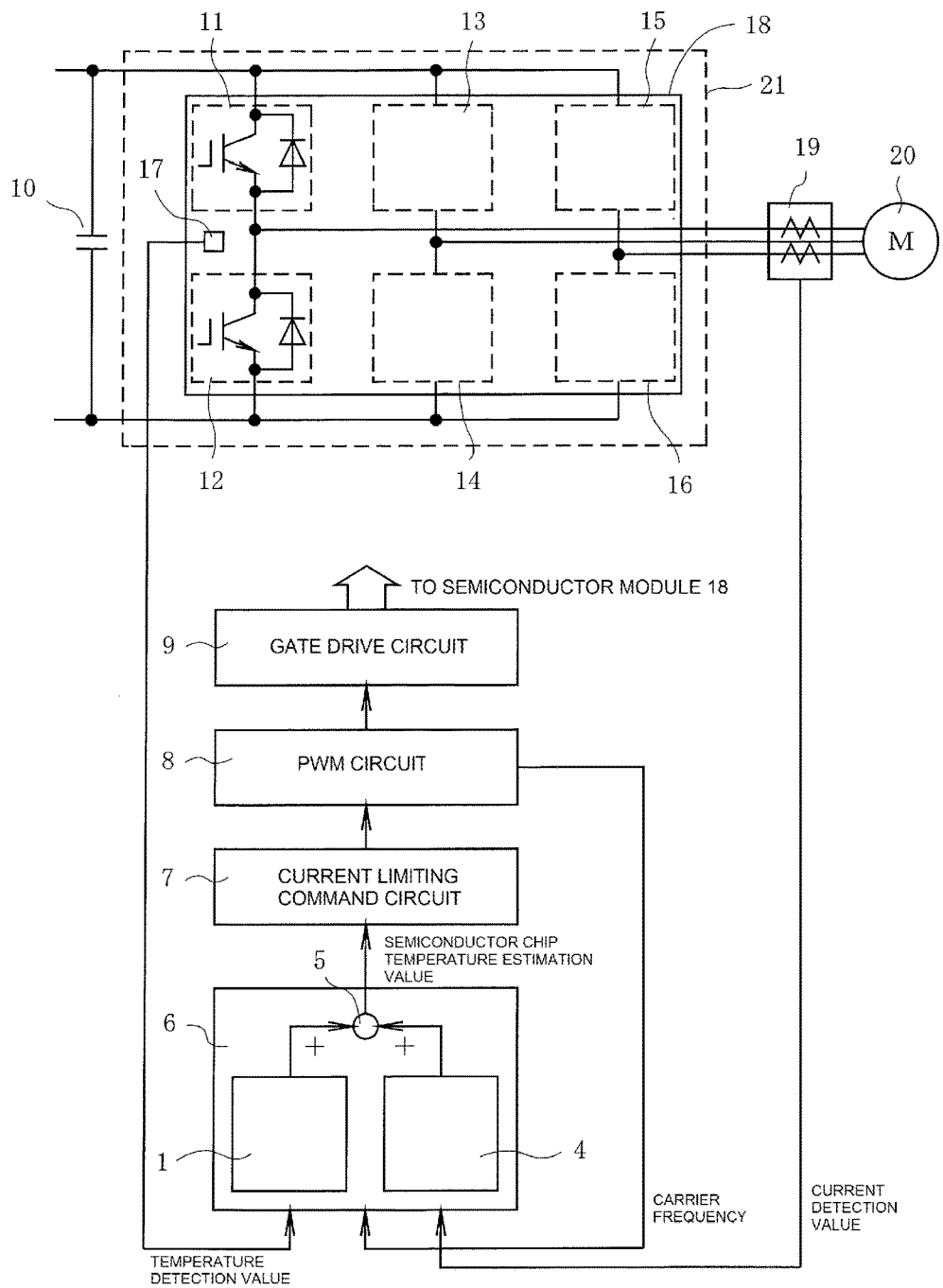
FIG. 1 is a block diagram of a power conversion device to which an embodiment of the invention is applied.

FIG. 1 is a block diagram of a power conversion device to which an embodiment of the invention is applied. The power conversion device is configured of a main circuit, which drives a motor using a power converter formed of a 3-phase inverter, and a control device of the inverter.

In the main circuit of FIG. 1, 10 is a smoothing capacitor to which direct current voltage is applied, 11 to 16 are semiconductor chips includes a semiconductor switching element such as an IGBT and a freewheeling diode, 17 is a thermistor acting as a temperature sensor, 18 is a semiconductor module, 19 is a current detector, 20 is a motor, which is the load of the inverter, and 21 is a heat sink that cools the semiconductor chips 11 to 16.

The kind and number of the semiconductor switching elements, and the kind and number of phases of the power converter, are not particularly limited.

Meanwhile, the control device has a semiconductor chip temperature estimation device 6 of the embodiment, into which are input a detected temperature value from the thermistor 17, a current value of the motor 20 detected by the current detector 19, and a carrier frequency from a PWM circuit 8, to be described hereafter. The semiconductor chip temperature estimation device 6 includes a cooling element temperature estimation unit 1, a semiconductor chip temperature rise estimation unit 4, and adder and subtractor means 5 for adding the outputs of the two, wherein a semiconductor chip temperature estimation value output from the semiconductor chip temperature estimation device 6 is input into a current limiting command circuit 7.

When the semiconductor chip temperature estimation value exceeds the set value, the current limiting command circuit 7 generates a current limiting command for limiting the current flowing through the semiconductor switching elements (the inverter output current). Herein, the current limiting command also includes a command limiting the current to zero (causing the semiconductor switching elements to switch off).

The current limiting command is input into the PWM circuit 8. The PWM circuit 8 generates a PWM signal based on a voltage command from a control circuit not shown in the drawing, and outputs the PWM signal to a subsequent gate drive circuit 9. The gate drive circuit 9, by generating a gate signal whereby the semiconductor switching elements in the semiconductor chips 11 to 16 are caused to switch on and off, supplies 3-phase alternating current power to the motor 20 in accordance with a direct current/alternating current conversion operation of the inverter included in the semiconductor chips 11 to 16.

Next, a description will be given, in accordance with FIG. 2 to FIG. 6, of examples of the semiconductor chip temperature estimation device 6 according to the embodiment.

In the following examples, it is assumed that a cooling element that cools the semiconductor module 18 of FIG. 1 is a cooling medium such as water that forcibly cools the heat sink 21, and the cooling element temperature estimation unit in FIG. 1 is specified as cooling medium temperature estimation units 1B to 1D. Herein, other than a cooling medium, a cooling body such as a cooling fin may also be used as the cooling element, in which case the cooling body temperature is estimated as the cooling element temperature.

Figure 2:
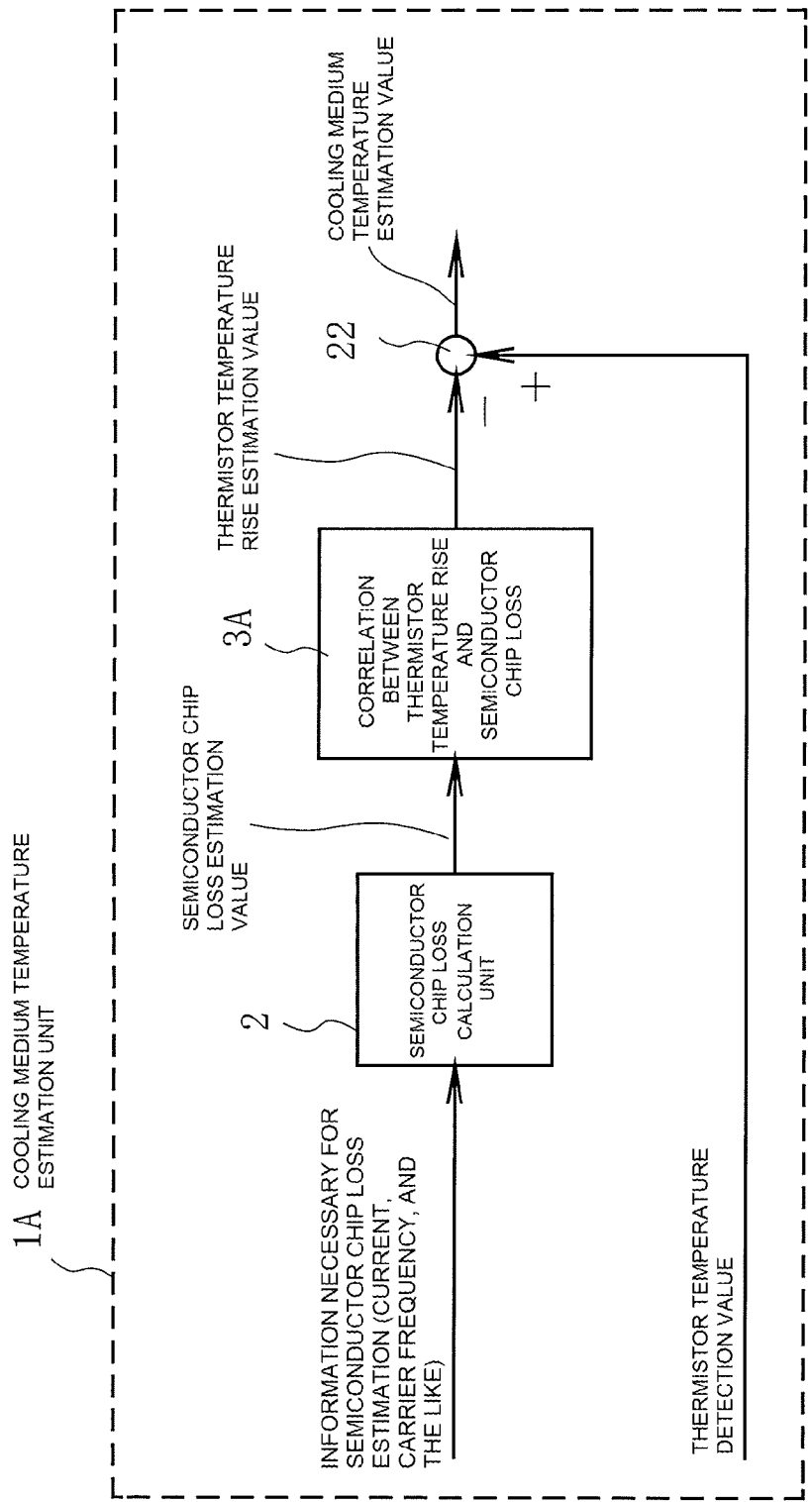
FIG. 2 is a block diagram showing a main portion of a first example of a semiconductor chip temperature estimation device in the embodiment.

Firstly, FIG. 2 is a block diagram showing a cooling medium temperature estimation unit 1A, which is a main portion of a first example of the semiconductor chip temperature estimation device 6.

In FIG. 2, the cooling medium temperature estimation unit 1A includes a semiconductor chip loss calculation unit 2, a correlation storage unit 3A, such as a memory, in which is stored the correlation between thermistor temperature rise and semiconductor chip loss, and adder and subtractor means 22 for adding and subtracting the output of the correlation storage unit 3A and the thermistor detected temperature value in accordance with the reference signs shown in the drawing. The cooling medium temperature estimation unit 1A is configured of hardware such as a CPU and memory, and of software that executes a predetermined operation, which point also applies to the cooling medium temperature estimation units 1B to 1D and semiconductor chip temperature rise estimation unit 4, to be described hereafter.

The semiconductor chip loss calculation unit 2 corresponds to a first estimation unit in the claims, the correlation storage unit 3A corresponds to a memory and a second estimation unit in the claims, and the adder and subtractor means 22 corresponds to a third estimation unit in the claims.

The semiconductor chip loss calculation unit 2 estimates chip loss of the semiconductor chip. More specifically, the semiconductor chip loss calculation unit 2 has a function of carrying out an estimated calculation of the loss in one semiconductor chip, wherein information necessary for estimating the semiconductor chip loss, such as the value of current detected by the current detector 19 and the carrier frequency (switching frequency) from the PWM circuit 8, is input into the semiconductor chip loss calculation unit 2. It is desirable that, as well as the detected current value and carrier frequency, characteristics of the switching elements and freewheeling diodes, and the like, are input into the semiconductor chip loss calculation unit 2, and the total value of conductivity loss and switching loss, the calculation of which is estimated for each switching element and freewheeling diode using the input information, is output as a semiconductor chip loss estimation value (a first estimation value of a chip loss of the semiconductor chip).

One of the common processes of calculating total power loss of the semiconductor chip is described in a publication "Automotive IGBT Module Application Note—Chapter 3—Heat Dissipation Design Method" (http://www.fujielectric.com/products/semiconductor/technical/application/box/doc/igbt_automotive/03.pdf), which is incorporated herein by reference.

Figure 3:
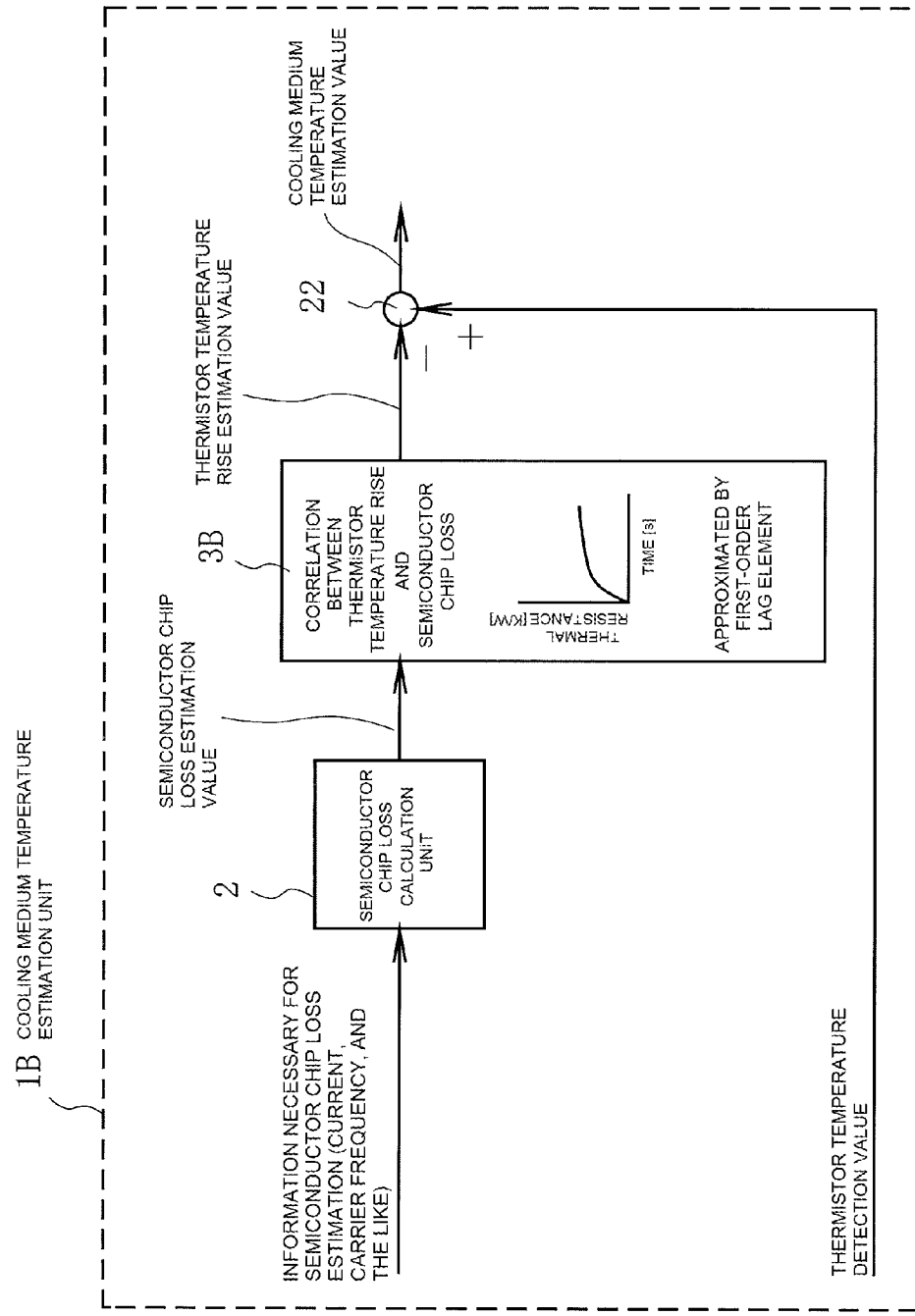
FIG. 3 is a block diagram showing a main portion of a second example of the semiconductor chip temperature estimation device in the embodiment.
Figure 4:
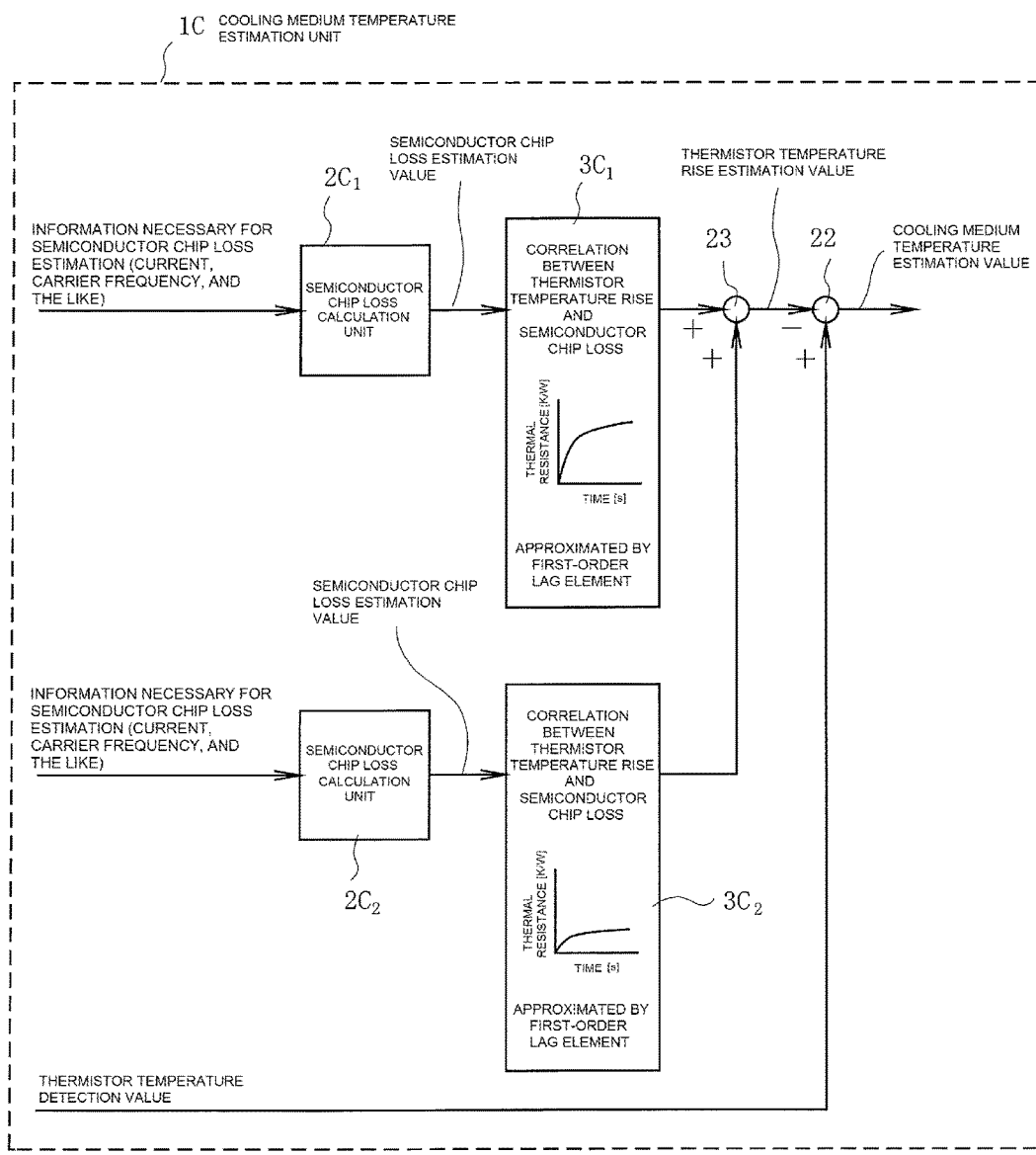
FIG. 4 is a block diagram showing a main portion of a third example of the semiconductor chip temperature estimation device in the embodiment.

That is:
(1) Calculate on-state power loss in the semiconductor chip by integrating the output current-voltage product of the semiconductor chip. Values of the output current and voltage are approximated by using PWM operation pattern (FIG. 3-1 of the publication) and a current-voltage datasheet of the semiconductor chip (FIG. 3-2 of the publication).
(2) Calculate switching loss in the semiconductor chip by taking sum of the loss in each switching period which is approximated by using PWM operation pattern (FIG. 3-1 of the publication) and a current-switching loss datasheet of the semiconductor chip (FIG. 3-4 of the publication).
(3) Calculate total power loss by adding the losses (1) and (2).

The correlation between thermistor temperature rise and semiconductor chip loss is stored in advance in the correlation storage unit 3A of FIG. 2.

Herein, the thermistor temperature rise (=a detected temperature value detected by a thermistor—a cooling medium temperature) is the value of the temperature detected by the thermistor 17 caused by heat generated by the semiconductor chip by using the cooling medium temperature as a reference temperature, and can be measured in advance. The cooling medium temperature is assumed to be constant.

Also, the relationship between heat generation caused by the semiconductor chip loss and the detected temperature value detected by the thermistor can also be measured in advance. Thus, it is possible to evaluate the correlation between the semiconductor chip loss and the thermistor temperature rise in advance, and store the correlation in the correlation storage unit 3A.

By using the correlation stored in the correlation storage unit 3A in this way, the thermistor temperature rise is estimated from the semiconductor chip loss estimation value, and the thermistor temperature rise estimation value is input into the adder and subtractor means 22 as a second estimation value of a temperature rise of the thermistor.

Meanwhile, the value of the temperature detected by the thermistor 17 incorporated in the semiconductor module 18 is also input into the adder and subtractor means 22. By the thermistor temperature rise estimation value being subtracted from the thermistor detected temperature value (as previously described, thermistor detected temperature value=thermistor temperature rise+cooling medium temperature) in the adder and subtractor means 22, it is possible to estimate the cooling medium temperature as a cooling medium temperature estimation value (a third estimation value of temperature of the cooling element).

By the cooling medium temperature estimation value and the output of the semiconductor chip temperature rise estimation unit 4 in FIG. 1 (the semiconductor chip temperature rise estimation value) being added by the adder and subtractor means 5, it is possible to calculate the semiconductor chip temperature estimation value. When the semiconductor chip temperature estimation value exceeds the set value, the current limiting command circuit 7 outputs a current limiting command, and carries out a protective operation via the PWM circuit 8, using current limiting operations that cause the on-duty of the semiconductor switching elements to vary, cause the semiconductor switching elements to switch off, and the like.

Figure 8:
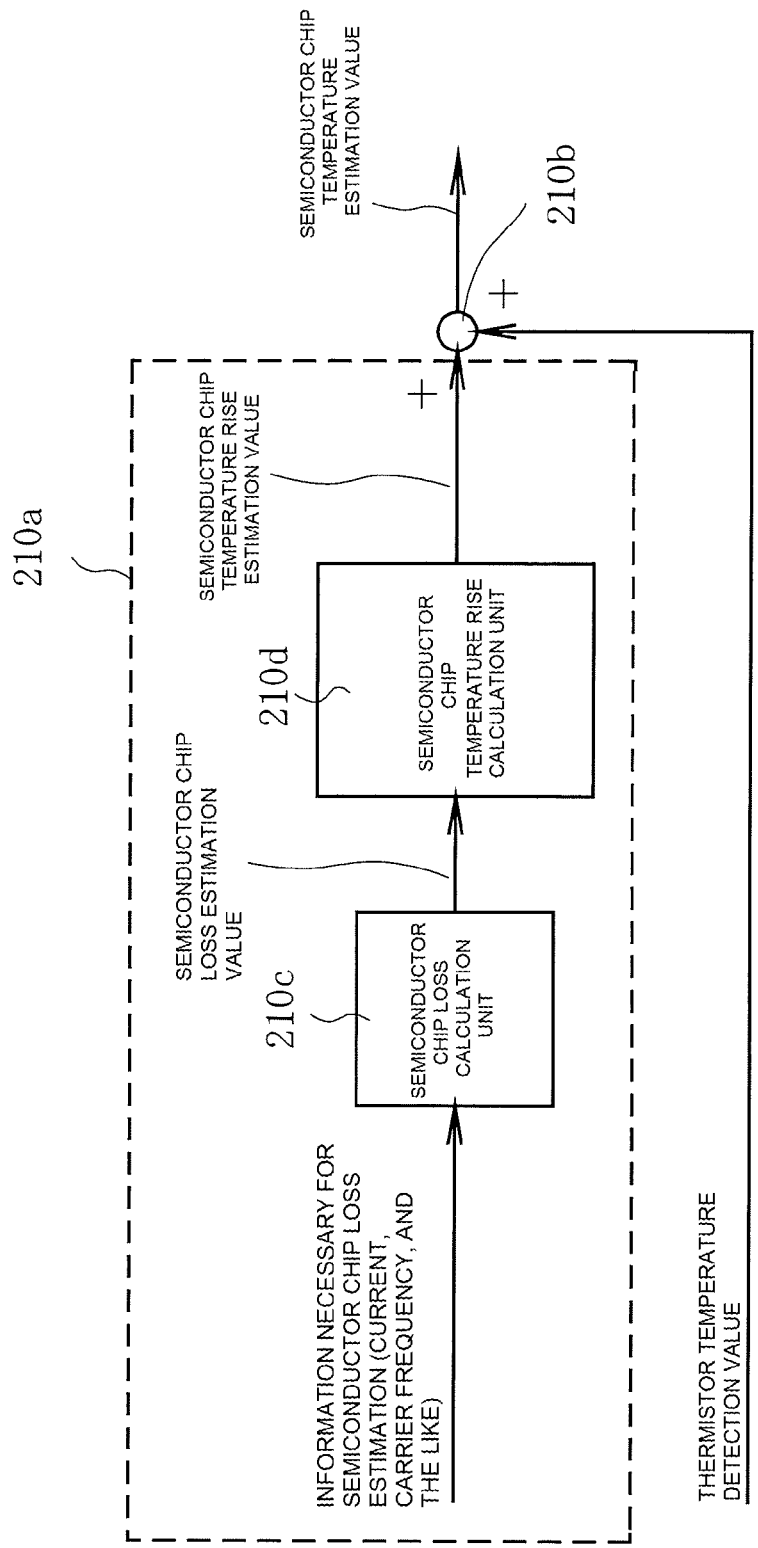
FIG. 8 is a schematic view showing a semiconductor chip temperature estimation function in a Tj estimation unit of FIG. 7.

The configuration of the semiconductor chip temperature rise estimation unit 4 is described in a fifth example, to be described hereafter, but may basically be the same as that of temperature rise estimation means 210a shown in FIG. 8.

As heretofore described, according to the first example, it is possible, using the semiconductor module 18 in which a thermistor is incorporated, to estimate the cooling medium temperature without installing a separate thermistor by inputting the value of the temperature detected by the thermistor into the cooling medium temperature estimation unit 1A together with information necessary for estimating semiconductor chip loss. Because of this, it is possible to carry out overheat protection without increasing the number of parts, and thus possible to reduce the cost and reduce the size of the power converter.

Herein, the related art shown in FIG. 8 is such that the thermistor detected temperature value (the detected temperature value of a cooling body or cooling medium) is used as a reference temperature of the semiconductor chip temperature estimation value, and the reference temperature is added to the semiconductor chip temperature rise estimation value by adder and subtractor means 210b, thus calculating the semiconductor chip temperature estimation value.

In this case, when heat is generated by the semiconductor chip disposed in the vicinity of the thermistor for detecting the temperature of the cooling body or cooling medium, the thermistor is affected by the semiconductor chip heat generation. Thus, it is not possible to correctly estimate the temperature of the cooling body or cooling medium. Consequently, when estimating the temperature of the semiconductor chip using the thermistor detected temperature value as it is as the reference temperature, as in FIG. 8, errors in the estimation of the semiconductor chip temperature increase in size, and it may happen that overheat protection cannot be safely and reliably carried out.

In response to this, according to the example, the thermistor temperature rise is estimated using a correlation that takes into account the effect on the thermistor of semiconductor chip heat generation, because of which it is possible to accurately estimate the cooling medium temperature by subtracting the temperature rise estimation value from the thermistor detected temperature value, and as a result, to estimate the semiconductor chip temperature with high accuracy.

Next, FIG. 3 is a block diagram of the cooling medium temperature estimation unit 1B, which is a main portion of a second example of the semiconductor chip temperature estimation device 6. In the second example, the correlation between thermistor temperature rise and semiconductor chip loss stored in a correlation storage unit 3B is specifically approximated by the kind of first-order lag element expressed in an equation 1.

$$R_{th} = R \times \{1 - \exp(-t/T_c)\} \quad \text{[Equation 1]}$$

$R_{th}$: the correlation between the thermistor temperature rise and semiconductor chip loss (first-order lag element)

R: the semiconductor chip steady thermal resistance [K/W]

$T_c$: the thermistor thermal time constant

Other than the above described method, a method of using a table storing data of the correlation between the thermistor temperature rise and semiconductor chip loss can also be considered, but such method has to ignore the effect of the thermal time constant $T_c$ on the thermistor temperature rise, and it is not possible to estimate the thermistor temperature rise when the current transiently changes when, for example, the motor 20, which is the load, rotates at low speed, accelerates, or decelerates.

On the other hand, by approximating the aforementioned correlation using a first-order lag element such as in the equation 1, it is possible to estimate the cooling medium temperature, and thus the semiconductor chip temperature, accurately and in real time.

As the steady thermal resistance R in the equation 1 is of a relationship such that R≈semiconductor chip temperature rise/semiconductor chip loss, it is easy to estimate the thermistor temperature rise from the semiconductor chip loss estimation value via the correlation $R_{th}$ of the equation 1.

FIG. 4 is a block diagram showing the cooling medium temperature estimation unit 1C, which is a main portion of a third example of the semiconductor chip temperature estimation device 6.

In the third example, firstly, each loss in a plurality of semiconductor chips that affect thermistor temperature rise is estimated. Then the respective thermistor temperature rise estimation value corresponding to each chip is calculated by using the respective correlation between thermistor temperature rise and the respective semiconductor chip loss of the respective semiconductor chip, and the plurality of thermistor temperature rise estimation values is added together. The cooling medium temperature is estimated by subtracting the total of the respective thermistor temperature rise estimation value from the thermistor detected temperature value.

In FIG. 4, semiconductor chip loss calculation units 2C1 and 2C2 estimate the loss in one each of two semiconductor chips like, for example, the semiconductor chips 11 and 12 in FIG. 1, wherein the function of each of the calculation units 2C1 and 2C2 is the same as that of the semiconductor chip loss calculation unit 2 in FIG. 2 and FIG. 3.

Also, correlation storage units 3C1 and 3C2 approximate the correlation between thermistor temperature rise and semiconductor chip loss by using, for example, a first-order lag element, as in the second example. However, as the correlation generally differs in accordance with the positional relationship between each semiconductor chip and the thermistor 17, the correlations stored in the correlation storage units 3C1 and 3C2 are not necessarily the same.

The thermistor temperature rise estimation values estimated using each of the correlations in the same way as in the second example are added by adder and subtractor means 23, and the cooling medium temperature estimation value is calculated by subtracting the added value from the thermistor detected temperature value in the subsequent adder and subtractor means 22.

According to the second example, even when the thermistor temperature rise is affected by heat generated not only by a semiconductor chip in the vicinity of the thermistor 17 but also by a semiconductor chip disposed far from the thermistor 17, it is possible, by estimating the thermistor temperature rise by using the correlation between the respective loss in each of the plurality of semiconductor chips and the respective thermistor temperature rise, to estimate the cooling medium temperature with still more accuracy, and thus to estimate the semiconductor chip temperature with high accuracy.

FIG. 4 shows a case wherein there are two semiconductor chips affecting the thermistor temperature rise, but it goes without saying that loss may be estimated for each of three or more semiconductor chips and correlations set, and the thermistor temperature rise estimated in the same way as that previously described.

Figure 5:
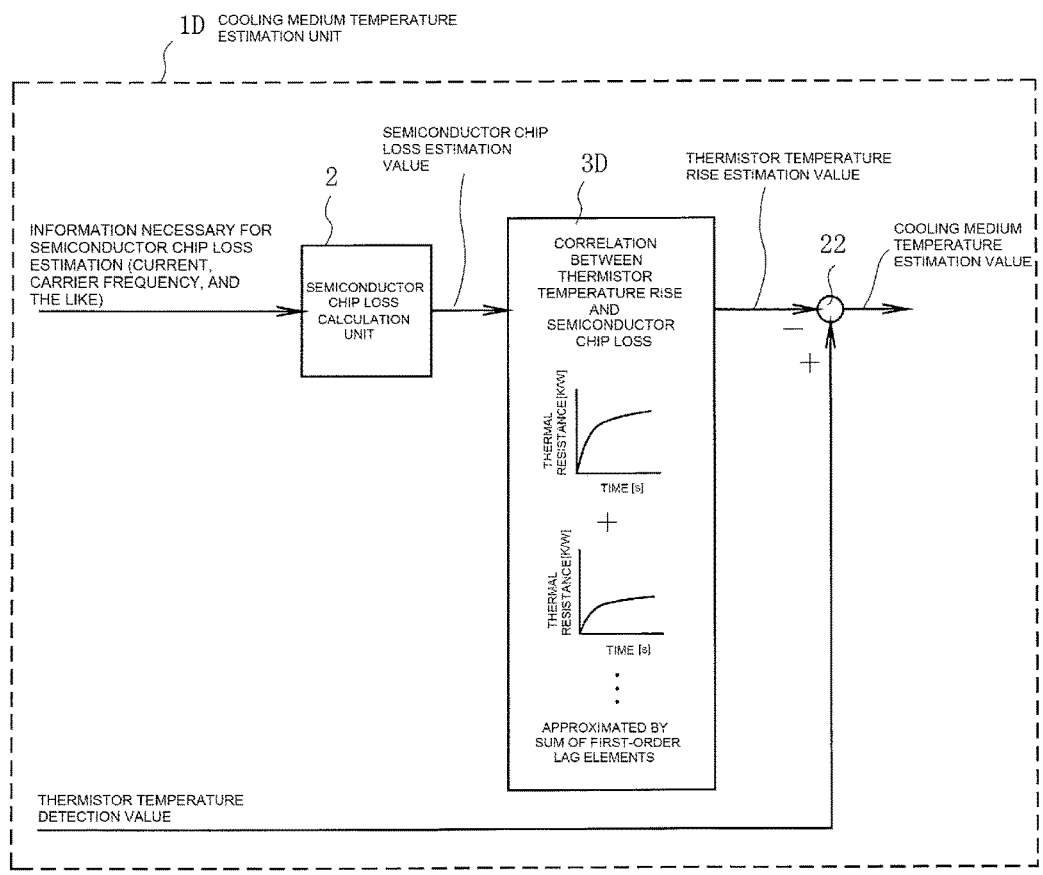
FIG. 5 is a block diagram showing a main portion of a fourth example of the semiconductor chip temperature estimation device in the embodiment.

Next, FIG. 5 is a block diagram showing the cooling medium temperature estimation unit 1D, which is a main portion of a fourth example of the semiconductor chip temperature estimation device 6.

In the fourth example, the correlation between thermistor temperature rise and semiconductor chip loss stored in a correlation storage unit 3D is approximated by the sum of a plurality of first-order lag elements such as shown in, for example, an equation 2. The equation 2 is the total of n of the first-order lag element shown in the equation 1.

$$R_{th} = \sum_{k=1}^{n} R_k \times \{1 - \exp(-t/T_{ck})\} \quad \text{[Equation 2]}$$

$R_{th}$: the correlation between the thermistor temperature rise and semiconductor chip loss (the sum of the first-order lag elements)

$R_k$: the semiconductor chip steady thermal resistance [K/W]

$T_{ck}$: the thermistor thermal time constant

According to the fourth example, even in the case of a correlation that cannot be precisely approximated with a single first-order lag element, as is done in the second example, it is possible to approach and simulate the actual correlation by combining a plurality of the first-order lag element, and thus possible to estimate the cooling medium temperature with higher accuracy.

Figure 6:
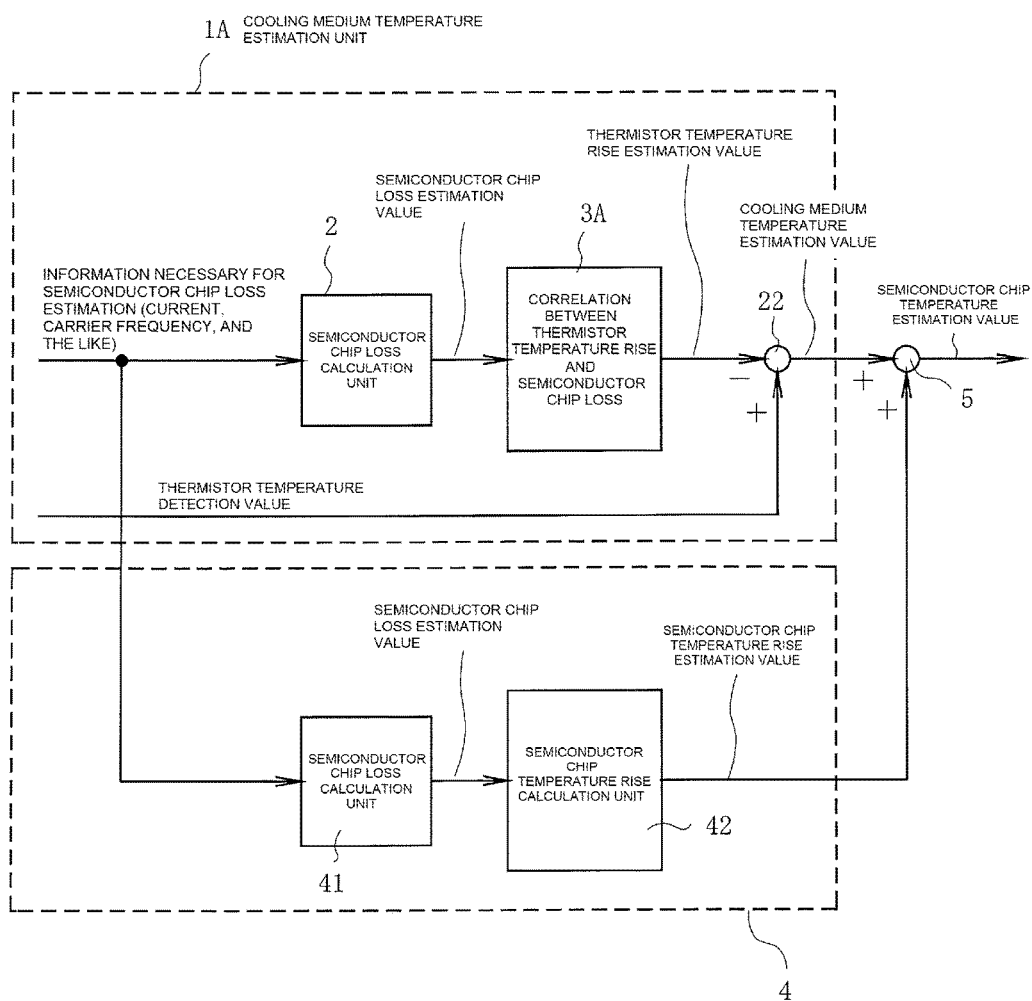
FIG. 6 is a block diagram showing a fifth example of the semiconductor chip temperature estimation device in the embodiment.
Figure 7:
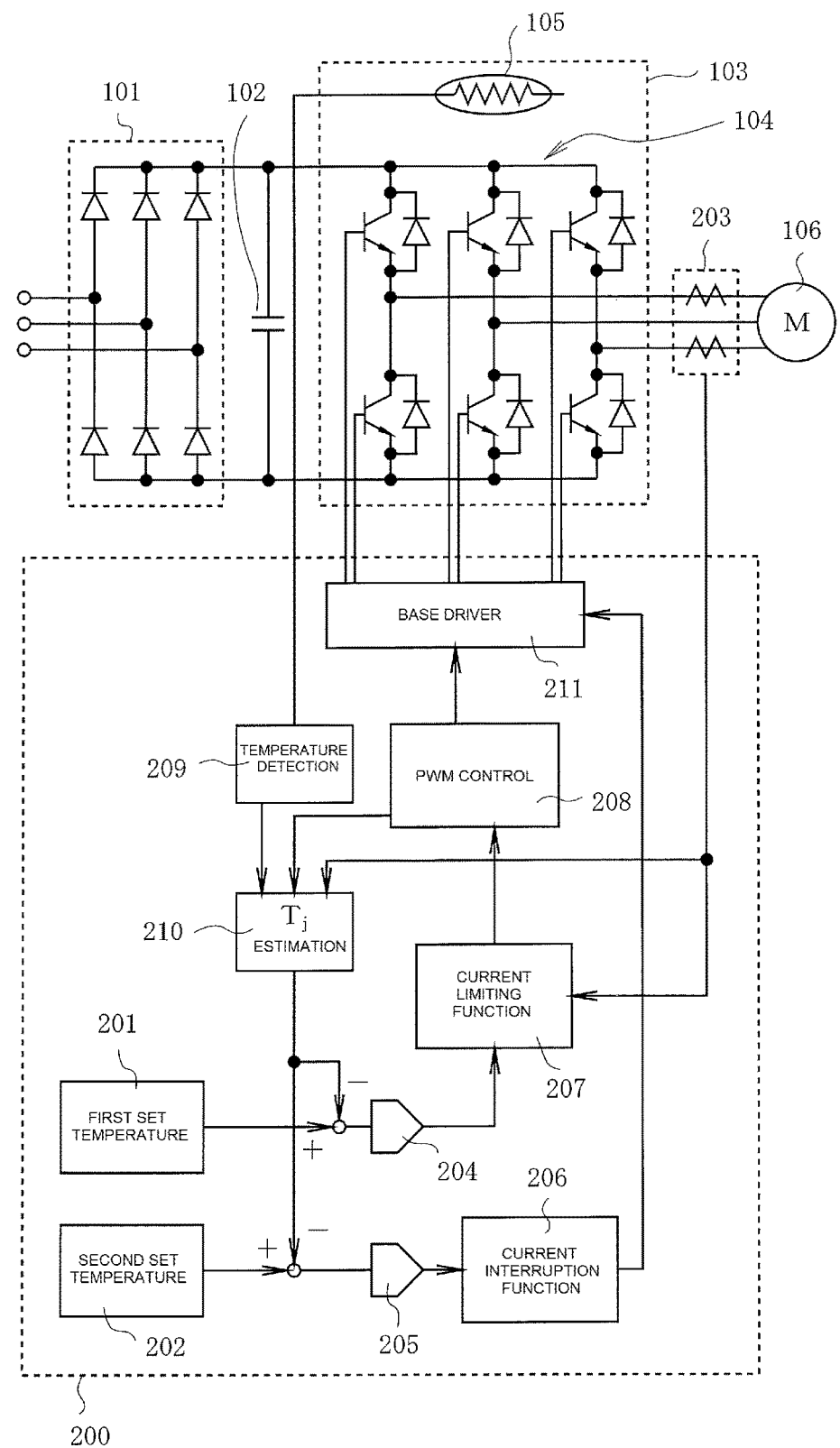
FIG. 7 is a configuration diagram of the related art described in Patent Document 1.

Next, FIG. 6 is a block diagram showing a fifth example of the semiconductor chip temperature estimation device 6.

The fifth example includes the cooling medium temperature estimation unit 1A shown in the first example of FIG. 2, and the semiconductor chip temperature rise estimation unit 4 and adder and subtractor means 5 in FIG. 1, and corresponds to a specific example of the overall configuration of the semiconductor chip temperature estimation device 6 of FIG. 1.

Here, the configuration and function of the cooling medium temperature estimation unit 1A are the same as in the first example.

The semiconductor chip temperature rise estimation unit 4, having practically the same configuration as the temperature rise estimation means 210a in FIG. 8, includes a semiconductor chip loss calculation unit 41 and a semiconductor chip temperature rise calculation unit 42.

The semiconductor chip loss calculation unit 41, having a function of carrying out an estimated calculation of the loss in one semiconductor chip in the same way as the semiconductor chip loss calculation unit 2 of the cooling medium temperature estimation unit 1A, estimates loss in the semiconductor chip based on information necessary for estimating the semiconductor chip loss, such as the value of current detected by the current detector 19 of FIG. 1 and the carrier frequency from the PWM circuit 8. The semiconductor chip temperature rise calculation unit 42, based on the semiconductor chip loss estimation value, estimates the temperature rise caused by heat generation in accordance with the loss, and outputs the estimation as a semiconductor chip temperature rise estimation value.

In the above configurations, for example, the semiconductor chip temperature rise estimation unit 4 corresponds to a fourth estimation unit in the claims, the semiconductor chip loss calculation unit 41 corresponds to a fifth estimation unit, and the semiconductor chip temperature rise calculation unit 42 corresponds to a sixth estimation unit.

That is, semiconductor chip temperature rise estimation unit 4 includes the semiconductor chip loss calculation unit 41 and the semiconductor chip temperature rise calculation unit 42, and estimates the temperature rise of the semiconductor chip. The semiconductor chip loss calculation unit 41 calculates the chip loss of the semiconductor chip, and its estimation process is same as the process of the first estimation unit. The semiconductor chip temperature rise calculation unit 42 calculates the temperature rise of the semiconductor chip by using the chip loss of the semiconductor chip calculated by the semiconductor chip loss calculation unit 41.

A common way of calculating the temperature rise of the semiconductor chip is described in the above cited publication "Automotive IGBT Module Application Note—Chapter 3—Heat Dissipation Design Method" (http://www.fujielectric.com/products/semiconductor/technical/application/box/doc/igbt_automotive/03.pdf), which is incorporated herein by reference:
(1) A thermal resistance between the semiconductor chip and the cooling element is obtained beforehand by measurements of actual devices (FIG. 3-6 of the publication)
(2) The temperature rise of the semiconductor chip is basically calculated as a product of the chip loss of the semiconductor chip and the thermal resistance between the semiconductor chip and the cooling element.

Further, by adding the cooling medium temperature estimation value output from the cooling medium temperature estimation unit 1A and the semiconductor chip temperature rise estimation value output from the semiconductor chip temperature rise estimation unit 4 by the adder and subtractor means 5, it is possible to calculate the semiconductor chip temperature estimation value. A current limiting action, or the like, can be carried out by inputting the semiconductor chip temperature estimation value into the current limiting command circuit 7 of FIG. 1 and bring compared with the set value.

According to the fifth example, when heat is generated by a semiconductor chip in the vicinity of the thermistor 17, it is possible to estimate the cooling medium temperature in real time and with high accuracy without the cooling medium temperature estimation unit 1A being affected by the heat generated by the semiconductor chip, and thus possible to estimate the semiconductor chip temperature with high accuracy by adding the cooling medium temperature estimation value and semiconductor chip temperature rise estimation value, which is of use in protecting the semiconductor chip and power converter against overheat.

The cooling medium temperature estimation units 1B to 1D in FIG. 3 to FIG. 5 (the second to fourth examples) may be used instead of the cooling medium temperature estimation unit 1A in FIG. 6.

INDUSTRIAL APPLICABILITY

The semiconductor chip temperature estimation device according to the invention can be utilized in estimating the temperature of a semiconductor chip having various kinds of semiconductor switching element such as an IGBT, FET, or thyristor. Also, the overheat protection device according to the invention can be utilized in the overheat protection of various kinds of power converter, such as an inverter, converter, or chopper, in which the semiconductor chip is mounted as a semiconductor module.

REFERENCE SIGNS LIST

1: Cooling element temperature estimation unit
1A, 1B, 1C, 1D: Cooling medium temperature estimation unit
2, 2C1, 2C2: Semiconductor chip loss calculation unit
3A, 3B, 3C1, 3C2, 3D: Correlation storage unit
4: Semiconductor chip temperature rise estimation unit
5, 22, 23: Adder and subtractor means
6: Semiconductor chip temperature estimation device
7: Current limiting command circuit
8: PWM circuit
9: Gate drive circuit
10: Smoothing capacitor
11 to 16: Semiconductor chip
17: Thermistor
18: Semiconductor module
19: Current detector
20: Motor
21: Heat sink
41: Semiconductor chip loss calculation unit
42: Semiconductor chip temperature rise calculation unit

What is claimed is:

1. A semiconductor chip temperature estimation device that estimates a temperature of a semiconductor chip incorporated together with a temperature sensor in a semiconductor module, the device comprising:
    a memory that stores in advance a correlation between a temperature rise of the temperature sensor and chip loss of the chip, said temperature rise being a difference between a detected temperature value detected by the temperature sensor and a temperature of a cooling element that cools the semiconductor module;
    a computing device; and
    a storage medium that stores program instructions, execution of which by the computing device causes the device to provide the functions of:
        a first estimation unit which calculates the chip loss of the semiconductor chip as a first estimation value using a value of current flowing through the chip and a value of a switching frequency used by a semiconductor switching element included in the chip;
        a second estimation unit that calculates the temperature rise of the temperature sensor as a second estimation value using the first estimation value and the correlation stored in the memory;
a third estimation unit that calculates the temperature of the cooling element as a third estimation value by subtracting the second estimation value from the detected temperature value; and
a chip temperature estimation unit that estimates the temperature of the semiconductor chip using the third estimation value as a reference temperature.

2. The semiconductor chip temperature estimation device according to claim 1, wherein the correlation stored in the storage unit is such that a relationship between the temperature rise of the temperature sensor and the chip loss is approximated by a first-order lag element.

3. The semiconductor chip temperature estimation device according to claim 1, wherein
the semiconductor module includes a plurality of semiconductor chips, and a total temperature rise of the temperature sensor is calculated using respective individual temperature rises of the plurality of chips,
the first estimation unit calculates respective individual chip losses of the plurality of semiconductor chips as respective individual first estimation values,
the memory stores in advance a plurality of individual correlations of respective individual temperature rises of the temperature sensor caused by said respective individual chip losses
the second estimation unit calculates each of the individual temperature rises of the temperature sensor as individual second estimation values using each of the respective individual first estimation values and each of the respective individual correlations stored in the memory, and
the third estimation unit calculates an estimation value by subtracting a total value of each of the individual second estimation values from the detected temperature value, as the third estimation value.

4. The semiconductor chip temperature estimation device according to claim 3, wherein
the first estimation unit includes a plurality of individual first estimation units each of which calculates a respective one of the individual first estimation values,
the memory includes a plurality of individual memories each of which stores a respective one of the individual correlations, and
the second estimation unit includes a plurality of individual second estimation units each of which calculates a respective one of the individual second estimation values.

5. The semiconductor chip temperature estimation device according to claim 1, wherein the correlation stored in the memory is such that a relationship between the temperature rise of the temperature sensor and the chip loss of the semiconductor chip is approximated by a sum of a plurality of first-order lag elements.

6. The semiconductor chip temperature estimation device according to claim 1, wherein the computing device causes the device to further provide the functions of
a fourth estimation unit which calculates a temperature rise of the chip as a fourth estimation value, the temperature rise of the chip being a difference of temperatures between the chip and the cooling element,
wherein the chip temperature estimation unit estimates the temperature of the semiconductor chip by adding together the third estimation value and the fourth estimation value.

7. The semiconductor chip temperature estimation device according to claim 6, wherein the fourth estimation unit includes:
a fifth estimation unit which calculates chip loss of the chip as a fifth estimation value using a value of current flowing through the chip and a value of a switching frequency used by the semiconductor switching element included in the chip; and
a sixth estimation unit which calculates the fourth estimation value using the fifth estimation value.

8. The semiconductor chip temperature estimation device according to claim 1, wherein the cooling element is a cooling medium which cools the semiconductor module.

9. The semiconductor chip temperature estimation device according to claim 1, wherein the computing device causes the device to further provide the functions of
a fourth estimation unit which calculates a temperature rise of the chip as a fourth estimation value, the temperature rise of the chip being a difference of temperatures between the chip and the cooling element,
wherein the chip temperature estimation unit obtains the temperature of the semiconductor chip using the third estimation value and the fourth estimation value.

10. An overheat protection device comprising:
a semiconductor chip temperature estimation device incorporated together with a temperature sensor in a semiconductor module, and
a control unit which limits current flowing through a semiconductor chip when a temperature of the chip estimated by the estimation device exceeds a predetermined value,
wherein the semiconductor chip temperature estimation device includes:
a memory that stores in advance a correlation between a temperature rise of the temperature sensor and chip loss, said temperature rise of the temperature sensor being a difference between a detected temperature value detected by the temperature sensor and a temperature of a cooling element that cools the semiconductor module;
a computing device; and
a storage medium that stores program instructions, execution of which by the computing device causes the device to provide the functions of:
a first estimation unit which calculates the chip loss of the semiconductor chip as a first estimation value;
a second estimation unit which calculates the temperature rise of the temperature sensor as a second estimation value using the first estimation value and the correlation stored in the memory;
a third estimation unit which calculates the temperature of the cooling element as a third estimation value by subtracting the second estimation value from the detected temperature value; and
a chip temperature estimation unit that estimates the temperature of the semiconductor chip using the third estimation value as a reference temperature.

11. A semiconductor chip temperature estimation device that estimates a temperature of a semiconductor chip included in a semiconductor module, the device comprising:
a computing device; and
a storage medium that stores program instructions, execution of which by the computing device causes the device to provide the functions of:
a first estimation unit which calculates chip loss of the semiconductor chip as a first estimation value;

a second estimation unit which calculates a temperature rise of a temperature sensor included in the semiconductor module as a second estimation value using the first estimation value and a correlation between the temperature rise of the temperature sensor and the chip loss of the semiconductor chip;

a third estimation unit which calculates the temperature of a cooling element as a third estimation value by subtracting the second estimation value from a detected temperature value, said cooling element cooling the semiconductor module, said detected temperature value being temperature detected by the temperature sensor; and a chip temperature estimation unit that estimates the temperature of the semiconductor chip using the third estimation value as a reference temperature.

12. The semiconductor chip temperature estimation device according to claim 11, wherein the correlation used by the second estimation unit is such that a relationship between the temperature rise of the temperature sensor and the chip loss of the chip is approximated by a first-order lag element.

13. The semiconductor chip temperature estimation device according to claim 11, wherein the semiconductor module includes a plurality of semiconductor chips, wherein the first estimation unit calculates the respective chip loss of the respective semiconductor chip as the respective first estimation value using both values of the respective current and the respective switching frequency used in the respective semiconductor chip;

wherein the second estimation unit calculates the respective temperature rise of the temperature sensor as the respective second estimation value using the respective first estimation value and the respective correlation between the temperature rise of the temperature sensor and the respective chip loss of the respective semiconductor chip, and wherein the third estimation unit calculates the third estimation value by subtracting a total value of the respective second estimation value from the detected temperature value.

14. The semiconductor chip temperature estimation device according to claim 11, wherein the correlation used by the second estimation unit is such that a relationship between the temperature rise of the temperature sensor and the chip loss of the semiconductor chip is approximated by a sum of a plurality of first-order lag elements.

15. The semiconductor chip temperature estimation device according to claim 11, wherein the computing device causes the device to further provide the functions of a fourth estimation unit which calculates a temperature rise of the chip as a fourth estimation value, wherein the chip temperature estimation unit estimates the temperature of the semiconductor chip by adding together the third estimation value and the fourth estimation value.

16. The semiconductor chip temperature estimation device according to claim 15, wherein the fourth estimation unit includes:

a fifth estimation unit which calculates chip loss of the semiconductor chip as a fifth estimation value using both values of current and a switching frequency used in the chip; and a sixth estimation unit which calculates the temperature rise of the chip as the fourth estimation value using the fifth estimation value.

17. The semiconductor chip temperature estimation device according to claim 11, wherein the cooling element is a cooling medium which cools the semiconductor module.

* * * * *